United States Patent
Park et al.

(10) Patent No.: US 7,652,308 B2
(45) Date of Patent: Jan. 26, 2010

(54) SEMICONDUCTOR DEVICE HAVING GATE-ALL-AROUND STRUCTURE AND METHOD OF FABRICATING THE SAME

(75) Inventors: Yoon-Dong Park, Yongin-si (KR); Suk-Pil Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 115 days.

(21) Appl. No.: 11/653,863

(22) Filed: Jan. 17, 2007

(65) Prior Publication Data
US 2007/0181959 A1  Aug. 9, 2007

(30) Foreign Application Priority Data
Feb. 7, 2006  (KR) .................. 10-2006-0011829

(51) Int. Cl.
*H01L 29/78* (2006.01)
(52) U.S. Cl. .................. 257/175; 257/E21.014; 257/153; 257/401; 257/E29.2; 257/E29.267; 257/E21.442; 257/365; 438/286
(58) Field of Classification Search .................. None
See application file for complete search history.

(56) References Cited
U.S. PATENT DOCUMENTS 6,664,582 B2   12/2003  Fried et al.
6,844,238 B2   1/2005   Yeo et al.
6,970,373 B2 * 11/2005  Datta et al. .................. 365/154
7,361,958 B2 * 4/2008   Brask et al. .................. 257/369
2006/0172497 A1 * 8/2006 Hareland et al. ............ 438/286

* cited by examiner

*Primary Examiner*—Minh-Loan T Tran
*Assistant Examiner*—Fei Fei Yeung Lopez
(74) *Attorney, Agent, or Firm*—Harness, Dickey & Pierce, P.L.C.

(57) ABSTRACT

Semiconductor devices having a gate-all-around (GAA) structure capable of higher operating performance may be provided. A semiconductor device may include a semiconductor substrate, at least one gate electrode, and at least one gate insulating layer. The semiconductor substrate may have a body, at least one supporting post protruding from the body, and at least one pair of fins separated from the body, wherein both ends of each fin of the at least one pair of fins are connected to and supported by the at least one supporting post. The at least one gate electrode may enclose a portion of at least one fin of the at least one pair of fins of the semiconductor substrate, and may be insulated from the semiconductor substrate. The at least one gate insulating layer may be interposed between the at least one gate electrode and the at least one pair of fins of the semiconductor substrate.

28 Claims, 12 Drawing Sheets

SEMICONDUCTOR DEVICE HAVING GATE-ALL-AROUND STRUCTURE AND METHOD OF FABRICATING THE SAME

PRIORITY STATEMENT

This application claims the benefit of priority to Korean Patent Application No. 10-2006-0011829, filed on Feb. 7, 2006, in the Korean Intellectual Property Office, the entire contents of which is incorporated herein in its entirety by reference.

BACKGROUND

1. Field

Example Embodiments relate to semiconductor devices and methods of fabricating the same, and more particularly, to semiconductor devices that may have a gate-all-around (GAA) structure and methods of fabricating the same.

2. Description of Related Art

As the integration density of semiconductor devices increases, design rules for components of the semiconductor devices may become stricter. For example, in semiconductor devices requiring a large number of transistors, gate length, which is one of the criteria of the design rules, may decrease, and thus channel length may decrease. The reduction in the channel length of transistors may lead to an increase in short channel effects.

The short channel effect may refer to the decrease of threshold voltage as the effective channel length of a transistor may decrease due to a drain potential effect. Because of this short channel effect, it may be difficult to control a transistor, and the OFF current of a transistor may increase. As a result, the reliability of transistors, for instance the refresh characteristic of a memory device, may deteriorate.

Currently, research is being conducted into a semiconductor device including a transistor that may have a fin-channel structure that may use surfaces of the fins as channels, a so-called fin type field effect transistor (finFET), which may be able to reduce or inhibit the short channel effect that exists in conventional planar type transistors and simultaneously increase operating current.

Conventional finFets may use upper and lateral surfaces of a fin as a channel region. Conventional finFets may also use lateral and upper surfaces, and part of a lower surface of a semiconductor fin as a channel region.

However, conventional finFETs may be fabricated using a silicon-on-insulator (SOI) substrate, thus having higher fabrication costs. Further, because an entire lower surface of the fin is not used as the channel region, there may be a limitation on the increase of the operating current. Hence, research has been conducted into a finFET that may have a gate-all-around (GAA) structure where the entire area, e.g. lateral, upper and lower surfaces, of the fin may be able to be used as the channel region, and various semiconductor devices using the same.

SUMMARY

Example embodiments may provide semiconductor devices having a gate-all-around (GAA) structure, capable of providing higher performance of operation.

Example embodiments may also provide semiconductor devices having a gate-all-around (GAA) structure using a bulk semiconductor substrate.

According to an example embodiment, there may be provided a semiconductor device having a gate-all-around (GAA) structure, including a semiconductor substrate, at least one gate electrode, and at least one gate insulating layer. The semiconductor substrate may have a body, at least one supporting post protruding from the body, and at least one pair of fins separated from the body, wherein at least one end of each fin of the at least one pair of fins may be connected to and may be supported by the at least one supporting post. The at least one gate electrode may enclose a portion of at least one fin of the at least one pair of fins of the semiconductor substrate, and may be insulated from the semiconductor substrate. The at least one gate insulating layer may be interposed between the at least one gate electrode and the pair of fins of the semiconductor substrate.

According to an example embodiment, the at least one gate electrode may be a common gate electrode enclosing a portion of each fin of the at least one pair of fins.

According to an example embodiment, the at least one supporting post may be a pair of supporting posts, both ends of each fin of the at least one pair of fins may be connected to and supported by the pair of supporting posts, and the at least one gate electrode may be a common gate electrode enclosing a portion of each fin of the at least one pair of fins.

According to an example embodiment, the at least one gate electrode may be a first gate electrode enclosing a portion of a first fin of the at least one pair of fins and a second gate electrode enclosing a portion of a second fin of the at least one pair of fins.

According to an example embodiment, the at least one supporting post may be a pair of supporting posts, both ends of each fin of the at least one pair of fins may be connected to and supported by the pair of supporting posts, and the at least one gate electrode may be a first gate electrode enclosing a portion of a first fin of the at least one pair of fins and a second gate electrode enclosing a portion of a second fin of the at least one pair of fins.

According to an example embodiment, the at least one supporting post may comprise sink regions that may be each recessed along an outer circumference of each of the at least one supporting post below the lower ends of the at least one pair of fins.

According to an example embodiment, the semiconductor device may further comprise a device insulating layer interposed between part of the at least one gate electrode and the body.

According to an example embodiment, there may be provided a semiconductor device that may have a gate-all-around (GAA) structure, comprising a semiconductor substrate, a first gate electrode, a second gate electrode, and gate insulating layers. The semiconductor substrate may have a body, a supporting post protruding upward from the body, and a pair of fins separated from the body, wherein an end of each may be connected to and supported by the supporting post. The first gate electrode may enclose a portion of a first fin of the pair of fins of the semiconductor substrate and may be insulated from the semiconductor substrate. The second gate electrode may enclose a portion of the second fin of the pair of fins of the semiconductor substrate and may be insulated from the semiconductor substrate. The gate insulating layers may be interposed between the first gate electrode and the first fin of the semiconductor substrate, and between the second gate electrode and the second fin of the semiconductor substrate.

According to an example embodiment, there may be provided a semiconductor device that may have a gate-all-around (GAA) structure, comprising a semiconductor substrate, a first pass gate electrode, a first pull down gate electrode, a first load gate electrode, a second load gate electrode, a second pull down gate electrode, and a second pass gate electrode. The semiconductor substrate may have a body, first, second, and third supporting posts protruding upward from the body, and first, second and third pairs of fins separated from the body, wherein one end of each fin of each of the first, second and third pairs may be connected to and supported by each of the first, second, and third supporting posts, respectively. The first pass gate electrode may enclose a portion of one of the first pair of fins connected to the first supporting post of the semiconductor substrate and may be insulated from the semiconductor substrate. The first pull down gate electrode may enclose a portion of the other of the first pair of fins connected to the first supporting post of the semiconductor substrate and may be insulated from the semiconductor substrate. The first load gate electrode may enclose a portion of one of the second pair of fins connected to the second supporting post of the semiconductor substrate and may be insulated from the semiconductor substrate. The second load gate electrode may enclose a portion of the other of the second pair of fins connected to the second supporting post of the semiconductor substrate and may be insulated from the semiconductor substrate. The second pull down gate electrode may enclose a portion of one of the third pair of fins connected to the third supporting post of the semiconductor substrate and may be insulated from the semiconductor substrate. The second pass gate electrode may enclose a portion of the other of the third pair of fins connected to the third supporting post of the semiconductor substrate and may be insulated from the semiconductor substrate.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
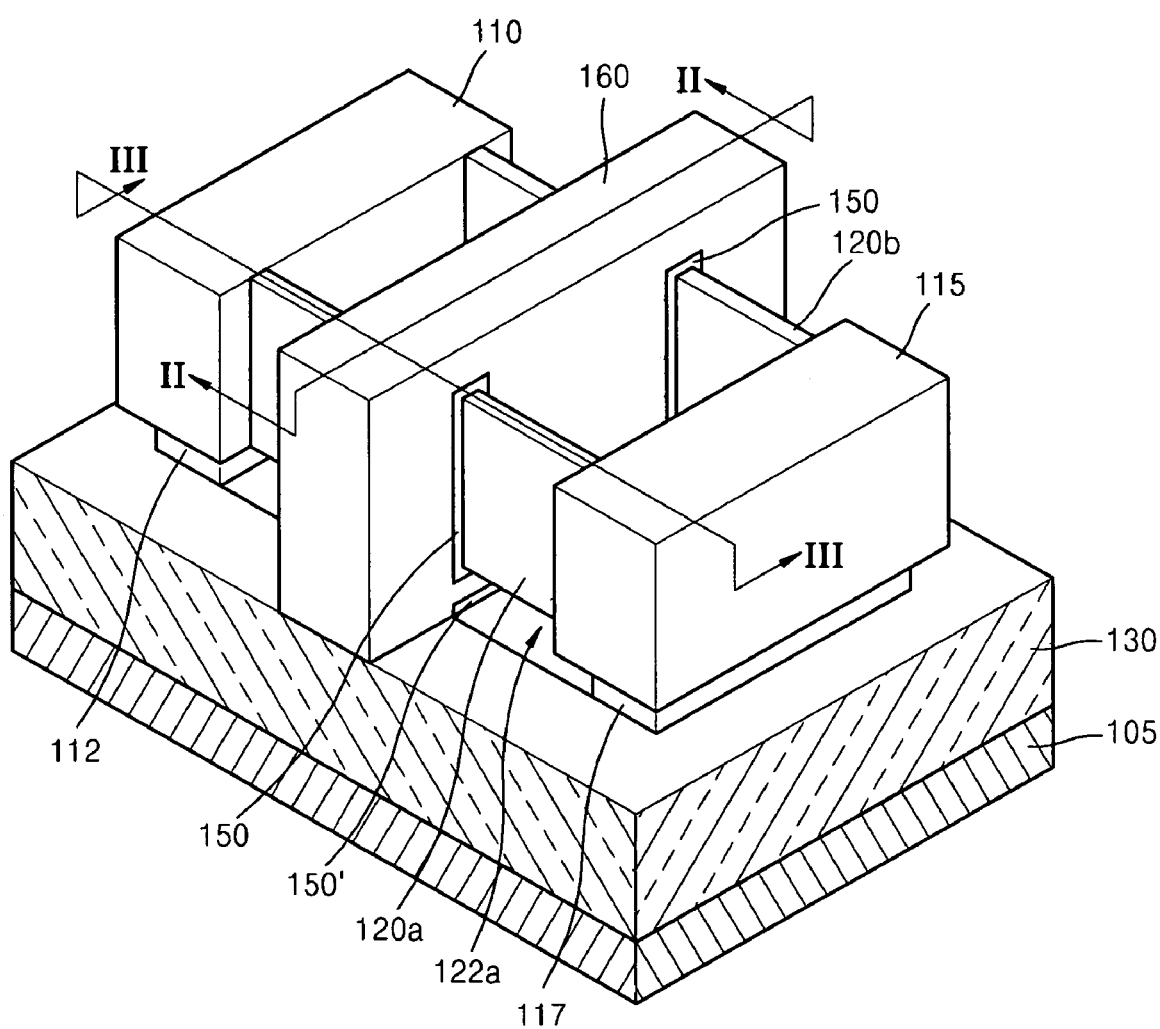
FIG. 1 is a perspective view illustrating a semiconductor device according to an example embodiment.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

According to example embodiments, a fin type field effect transistor (finFET) may use surfaces of a fin as a channel region, and a logic or memory device may use such a finFET. For example, the logic device may include an inverter device, and the memory device may include a static random access memory (SRAM) device. The finFET may have lower leakage current because the channel region may be almost completely depleted, thus reducing or softening the effect of the short channel effect.

A gate-all-around (GAA) structure may indicate that a gate electrode completely surrounds the fin. Because semiconductor devices having a GAA structure may have a wide channel region, they may have higher operating current and thus may be used for products requiring higher operating speed.

Figure 2:
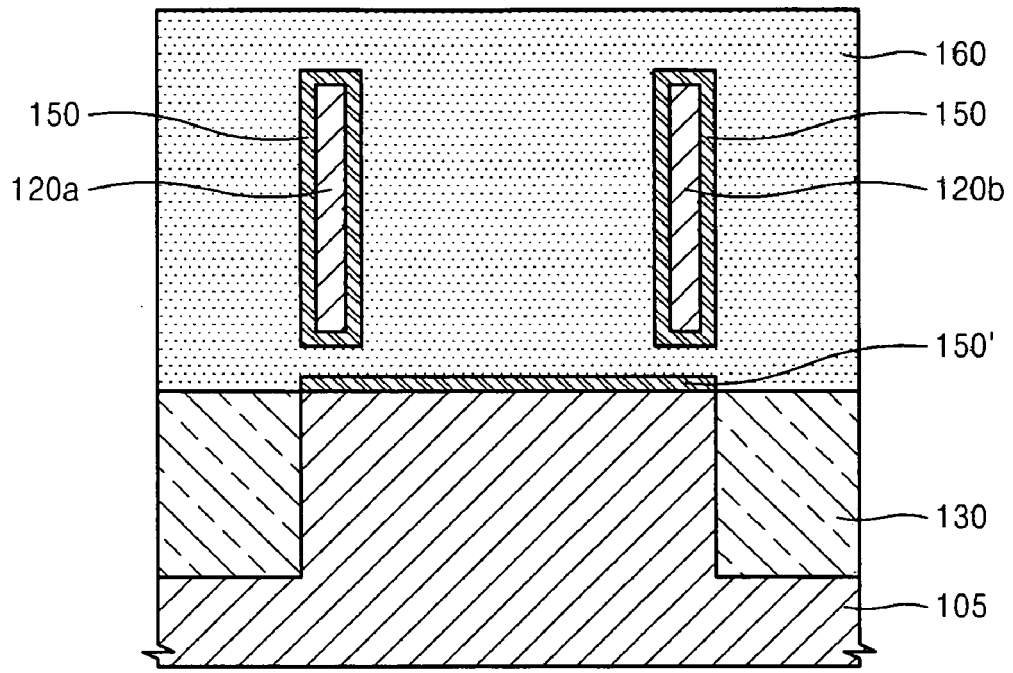
FIG. 2 is a cross-sectional view of the semiconductor device of FIG. 1 taken along a line II-II' of FIG. 1.
Figure 3:
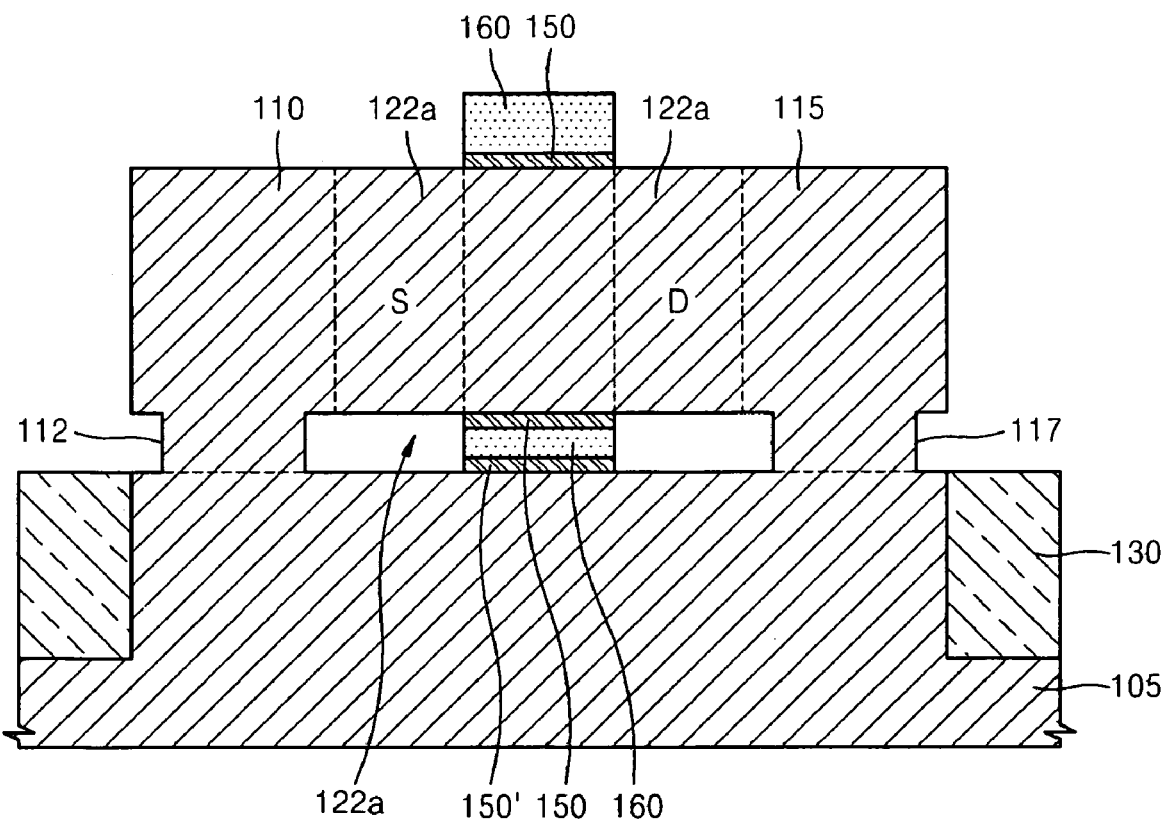
FIG. 3 is a cross-sectional view of the semiconductor device of FIG. 1 taken along a line III-III' of FIG. 1.

FIG. 1 is a perspective view illustrating a semiconductor device according to an example embodiment. FIG. 2 is a cross-sectional view of the semiconductor device of FIG. 1 taken along a line II-II' of FIG. 1. FIG. 3 is a cross-sectional view of the semiconductor device of FIG. 1 taken along a line III-III' of FIG. 1.

Referring to FIGS. 1 through 3, the semiconductor device may have a semiconductor substrate, which may comprise a body 105, a pair of supporting posts 110 and 115, and first and second fins 120a and 120b. The semiconductor substrate may be a bulk wafer. In an example embodiment, the body 105, the supporting posts 110 and 115, and the first and second fins 120a and 120b may be formed of the same material. For example, the semiconductor substrate may be a bulk silicon wafer or a bulk silicon-germanium wafer, which may be doped with impurities.

The body 105 may represent most of the semiconductor substrate, and example embodiments need not be limited to the shape of the body 105. For example, the body 105 may be a structure remaining after the supporting posts 110 and 115, and the first and second fins 120a and 120b may be formed from the bulk wafer. Example embodiments need not be limited to the above structure however, and the body 105 may include other fins (not shown), for instance residual portions of the first and second fins 120a and 120b, which may be separated from lower ends of the first and second fins 120a and 120b.

The supporting posts 110 and 115 may be each formed to protrude from the body 105, and disposed opposite to each other so as to allow the first and second fins 120a and 120b to be supported therebetween. The first and second fins 120a and 120b may be spaced apart from the body 105 and supported with both ends connected to the supporting posts 110 and 115 respectively. For example, the first fin 120a and the body 105 may be separated from each other by a tunnel 122a, and the second fin 120b and the body 105 may be separated from each other by another tunnel (not shown). For example, the first and second fins 120a and 120b each may protrude in a plate form over the body 105, and may be separated from the body 105 by the tunnel 122a and the other tunnel.

According to an example embodiment, the tunnel 122a and the other tunnel may have the shape of a cubic box. However, example embodiments need not be limited thereto. For example, the height of each of the tunnel 122a and the other tunnel may be reduced toward the middle of each of the first and second fins 120a and 120b. The supporting posts 110 and 115 may include sink regions 112 and 117 respectively, each of which may be recessed along the outer circumference of each of the supporting posts 110 and 115 below the lower ends of the first and second fins 120a and 120b. For example, portions of the supporting posts 110 and 115 corresponding to the sink regions 112 and 117 may have a width less than the other portions of the supporting posts 110 and 115. Furthermore, the tunnel 122a and the other tunnel may be disposed on the same plane as each of the sink regions 112 and 117.

A common gate electrode 160 may enclose at least part of each of the first and second fins 120a and 120b, and may be insulated from the semiconductor substrate, e.g. the body 105, the supporting posts 110 and 115, and the first and second fins 120a and 120b. In other words, the common gate electrode 160 may have a GAA structure. Further, the common gate electrode 160 may be adapted to have the portions enclosing the first and second fins 120a and 120b connected integrally, and thus may commonly correspond to the first and second fins 120a and 120b. Surrounding regions of surfaces of the first and second fins 120a and 120b enclosed by the common gate electrode 160 may be used as channel regions (not shown). The common gate electrode 160 may control the channel regions of the first and second fins 120a and 120b at the same time. The common gate electrode 160 may include a polysilicon layer, a metal layer, a metal silicide layer or a composite layer thereof.

The GAA structure of the semiconductor device according to example embodiments may use all lateral, upper, and lower surfaces of the first and second fins 120a and 120b as the channel region, thereby increasing the operating current. Increasing the operating current may lead to improved performance, such as higher operating speed, of the semiconductor device.

A first gate insulating layer 150 may be interposed between the common gate electrode 160 and each of the first and second fins 120a and 120b. Furthermore, a second gate insulating layer 150' may be interposed between the body 105 and the common gate electrode 160. The first gate insulating layer 150 and the second gate insulating layer 150' may insulate the common gate electrode 160 from the semiconductor substrate, and simultaneously may have a desired or predetermined thickness so that the common gate electrode 160 may appropriately control the channel regions formed around the first and second fins 120a and 120b. For example, the first gate insulating layer 150 may include an oxide layer or a high-k dielectric layer.

The first and second fins 120a and 120b may be doped with first conductive impurities. Other portions of the pair of fins 120a and 120b which may be located on opposite sides of the common gate electrode 160 may be used as a source region S and a drain region D. The source region S and the drain region D may be doped with second conductive impurities. The source region S and the drain region D may extend up to the supporting posts 110 and 115. In other words, the supporting posts 110 and 115 may be doped with the same conductive impurities as the source region S and the drain region D. The source region S and the drain region D may be subjected to a diode junction with the body 105. For example, the first conductive impurities may be P type impurities, and the second conductive impurities may be N type impurities, and vice versa.

The semiconductor device may additionally include a device insulating layer 130 interposed between part of the common gate electrode 160 and the body 105. For example, the device insulating layer 130 may be formed on the body 105 around the supporting posts 110 and 115 so as to expose the sink regions 112 and 117 of the supporting posts 110 and 115, and part of the common gate electrode 160 may be formed on the device insulating layer 130. The device insulating layer 130 may include an oxide layer or a nitride layer.

The above-described semiconductor device may have a GAA structure of a finFET. In other words, the common gate electrode 160 may be formed to enclose parts of the first and second fins 120a and 120b, and thus the channel regions may be formed around the surfaces of the first and second fins 120a and 120b. Hence, the GAA structure of the finFET may have higher operating current, compared to a conventional finFET using only part of the surface of the fin as the channel region. As a result, the GAA structure of the finFET may have higher operating performance.

Moreover, the above-described semiconductor device may control the first and second fins 120a and 120b by means of the common gate electrode 160. Thus, channel regions may be simultaneously formed on the surface regions of the first and second fins 120a and 120b, so that the operating current may be further increased. For example, by adjusting the distance between the first and second fins 120a and 120b, the semiconductor device may have an operating speed at least twice that compared to a conventional finFET that may have the same area.

The semiconductor device according to an alternative example embodiment may be a modification of example embodiments of FIGS. 1 through 3. For example, the semiconductor device according to an alternative example embodiment may be distinguished from that of example embodiments of FIGS. 1 through 3 in that the semiconductor device may have one supporting post and a common gate electrode. For example, the semiconductor device of an example embodiment may have only the supporting post 110 or only the supporting post 115 of FIGS. 1 through 3.

Figure 4:
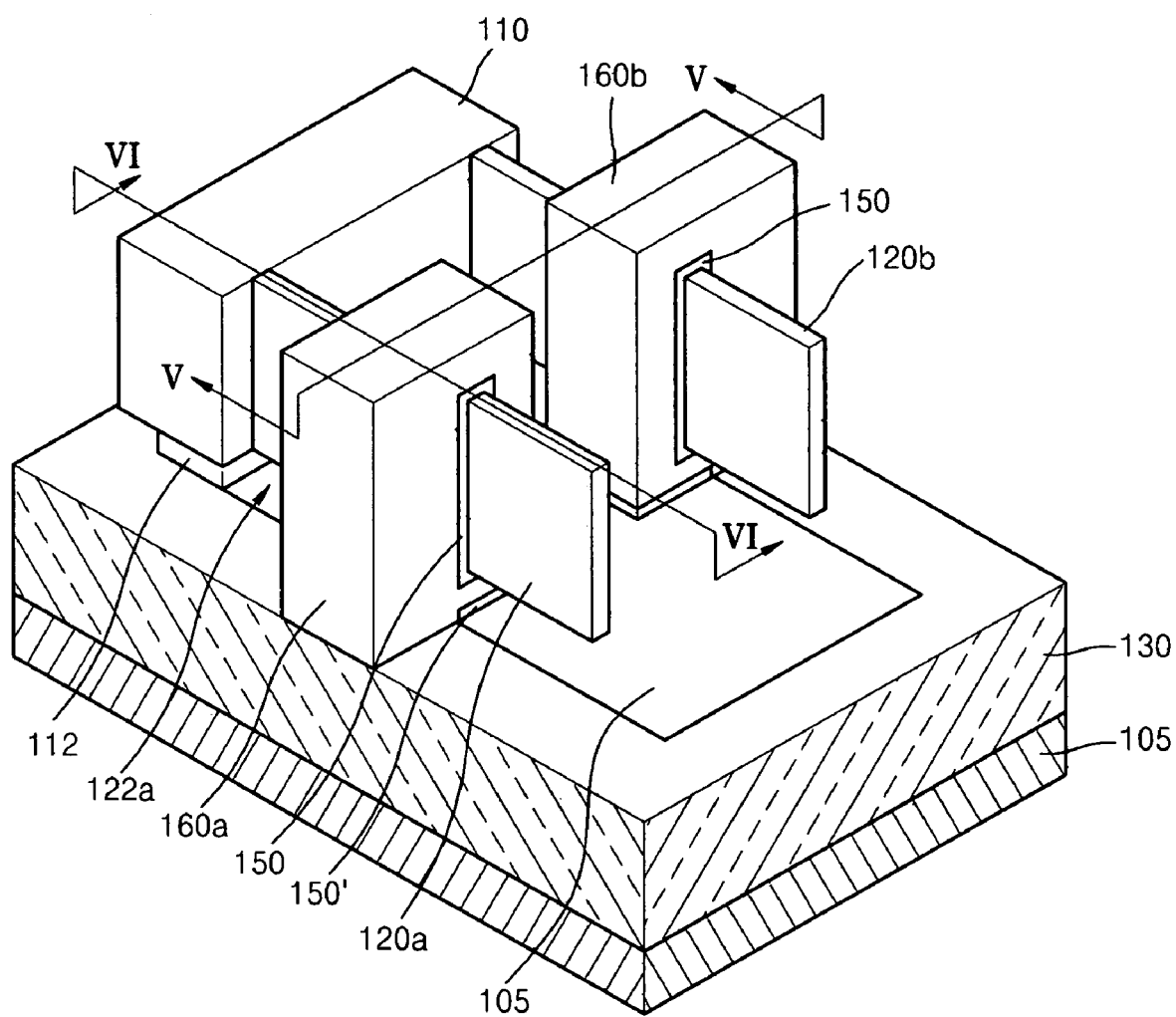
FIG. 4 is a perspective view illustrating a semiconductor device according to another example embodiment.
Figure 5:
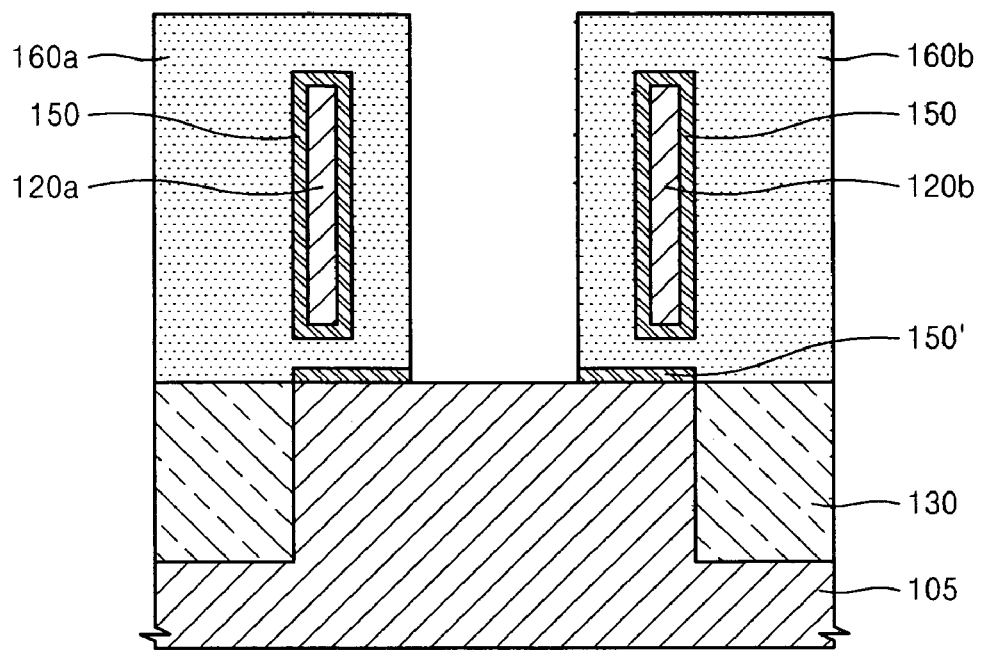
FIG. 5 is a cross-sectional view of the semiconductor device of FIG. 4 taken along a line V-V' of FIG. 4.
Figure 6:
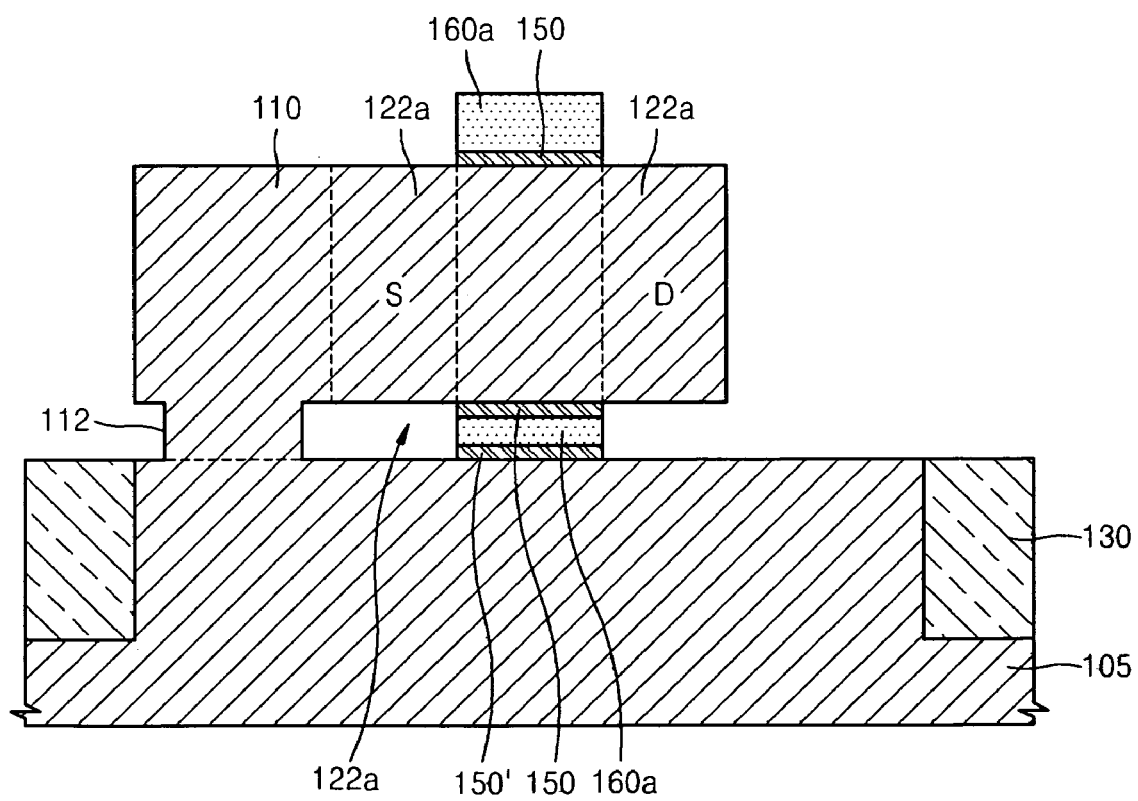
FIG. 6 is a cross-sectional view of the semiconductor device of FIG. 4 taken along a line VI-VI' of FIG. 4.

Hereinafter, a semiconductor device according to another example embodiment will be described with reference to FIGS. 4 through 6. FIG. 4 is a perspective view illustrating a semiconductor device according to another example embodiment. FIG. 5 is a cross-sectional view of the semiconductor device of FIG. 4 taken along a line V-V' of FIG. 4. FIG. 6 is a cross-sectional view of the semiconductor device of FIG. 4 taken along a line VI-VI' of FIG. 4.

The semiconductor device according to an example embodiment may be a modification of example embodiments of FIGS. 1 through 3. For example, the semiconductor device according to an example embodiment may be distinguished from that of example embodiments of FIGS. 1 through 3 in that the semiconductor device may have one supporting post and a pair of gate electrodes. Like reference numerals in example embodiments denote like elements, and thus their description will be omitted. Referring to FIGS. 4 through 6, first and second fins 120a and 120b may be supported by a first supporting post 110. Furthermore, the first and second fins 120a and 120b may be additionally supported by first and second gate electrodes 160a and 160b, respectively. However, example embodiments need not be limited thereto, and a second supporting post (115 of FIG. 1) instead of the first supporting post 110 may support the first and second fins 120a and 120b.

The first gate electrode 160a may enclose part of the first fin 120a and may be insulated from a semiconductor substrate. The second gate electrode 160b may enclose part of the second fin 120b and may be insulated from the semiconductor substrate. The first and second gate electrodes 160a and 160b may be formed so as to be separated from each other and disposed opposite to each other. First gate insulating layers 150 may be interposed between the first gate electrode 160a and the first fin 120a, and between the second gate electrode 160b and the second fin 120b.

For example, the first gate electrode 160a may be insulated from the first fin 120a by a first gate insulating layer 150, and from the body 105 by a second gate insulating layer 150' and a device insulating layer 130. The second gate electrode 160b may be insulated from the second fin 120b by another first gate insulating layer 150, and from the body 105 by another second gate insulating layer 150' and a device insulating layer 130.

A first channel region (not shown) may be formed around the surface of the first fin 120a enclosed by the first gate electrode 160a, whereas a second channel region (not shown) may be formed around the surface of the second fin 120b enclosed by the second gate electrode 160b. The other portions of the first fin 120a which may be located on opposite sides of the first gate electrode 160a may be formed into a first source region S and a first drain region D, respectively. The other portions of the second fin 120b which may be located on opposite sides of the second gate electrode 160b may be formed into a second source region (not shown) and a second drain region D, respectively.

Therefore, the first gate electrode 160a and the first fin 120a may form one finFET that may have a GAA structure, and the second gate electrode 160b and the second fin 120b may form another finFET that also may have a GAA structure.

Each semiconductor device according to example embodiments may be used as a logic device, for instance an inverter device. In an example embodiment, the two finFETs may have different conductive channels from each other. For example, if one finFET is an NMOS finFET, the other finFET is a PMOS finFET.

For example, the first and second fins 120a and 120b may be doped with different conductive impurities. For example, the first fin 120a may be doped with first conductive impurities, and the second fin 120b may be doped with second conductive impurities. According to an example embodiment, the first conductive impurities may be N type impurities, and the second conductive impurities may be P type impurities, and vice versa.

Furthermore, the first source region S and the first drain region D may be doped with the second conductive impurities different from those of the first fin 120a, whereas the second source region S and the second drain region D may be doped with the first conductive impurities different from those of the second fin 120a. In other words, the first fin 120a and the first gate electrode 160a may form an NMOS finFET, while the second fin 120b and the second gate electrode 160b may form a PMOS finFET. However, example embodiments need not be limited thereto.

In the case of the inverter device, a higher voltage may be applied to the first drain region D, and a lower voltage may be applied to the second drain region D. The higher voltage may be a power voltage, and the lower voltage may be a ground voltage. The first source region S and the second source region S may be used as a common output terminal. For example, the first source region S and the second source region S may be connected by forming a metal silicide layer on the first supporting post 110. In another example, the first source region S and the second source region S may be connected by forming a metal interconnection on the first supporting post 110.

The first and second gate electrodes 160a and 160b may be used as a common input terminal. For example, the first and second gate electrodes 160a and 160b may be connected by a metal interconnection. In another example embodiment, the first and second gate electrodes 160a and 160b may be formed in the structure of a common gate electrode (160 of FIG. 1), which may commonly correspond to the first and second fins 120a and 120b, as in example embodiments illustrated in FIGS. 1 to 3.

The above-described inverter device may occupy a smaller area. For example, supposing that the first and second gate electrodes 160a and 160b have a width of 1 F, and the first and second fins 120a and 120b have a width of 0.25 F, the inverter may be formed within an area of 4 F×2 F, or 8 $F^2$. Further, the inverter device may be composed of the finFETs that may have the GAA structure, thus the inverter device may have improved performance characteristics such as higher operating speed.

The semiconductor device according to an alternative example embodiment may be a modification of example embodiments of FIGS. 4 through 6. For example, the semiconductor device according to an alternative example embodiment may be distinguished from example embodiments of FIGS. 4 through 6, in that it may have a pair of supporting posts and a pair of gate electrodes. For example, a semiconductor device of an example embodiment may have a pair of supporting posts 100 and 115 of FIGS. 1 through 3 and the first and second gate electrodes 160a and 160b, respectively, of FIGS. 4 through 6.

Figure 7:
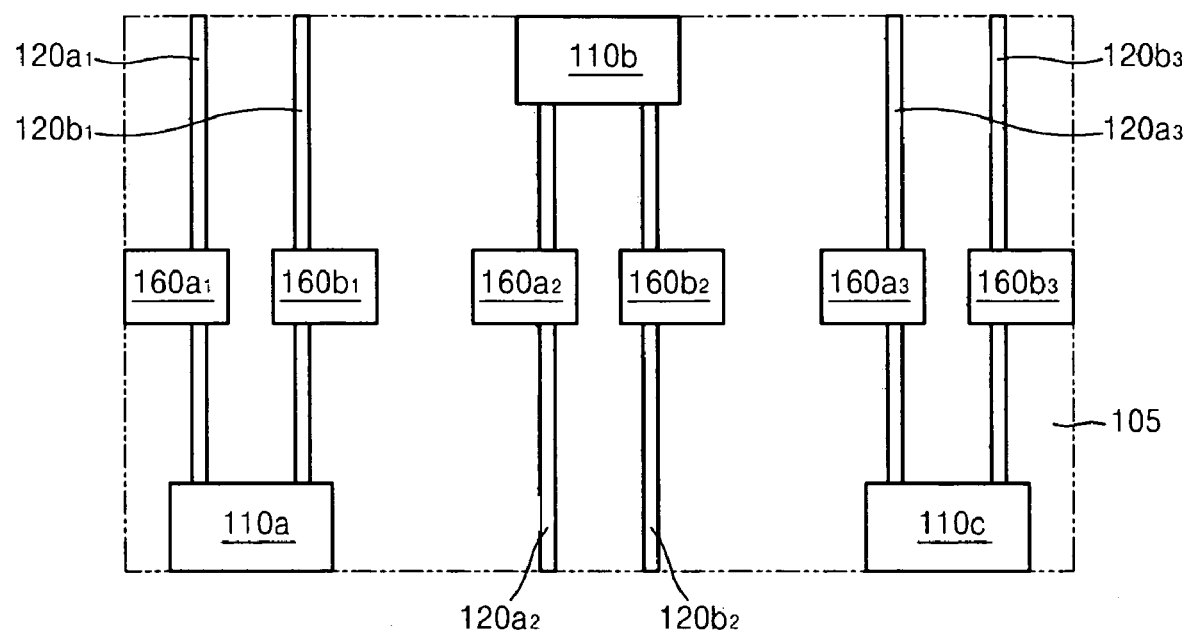
FIG. 7 is a top plan view illustrating a semiconductor device according to another example embodiment.
Figure 8:
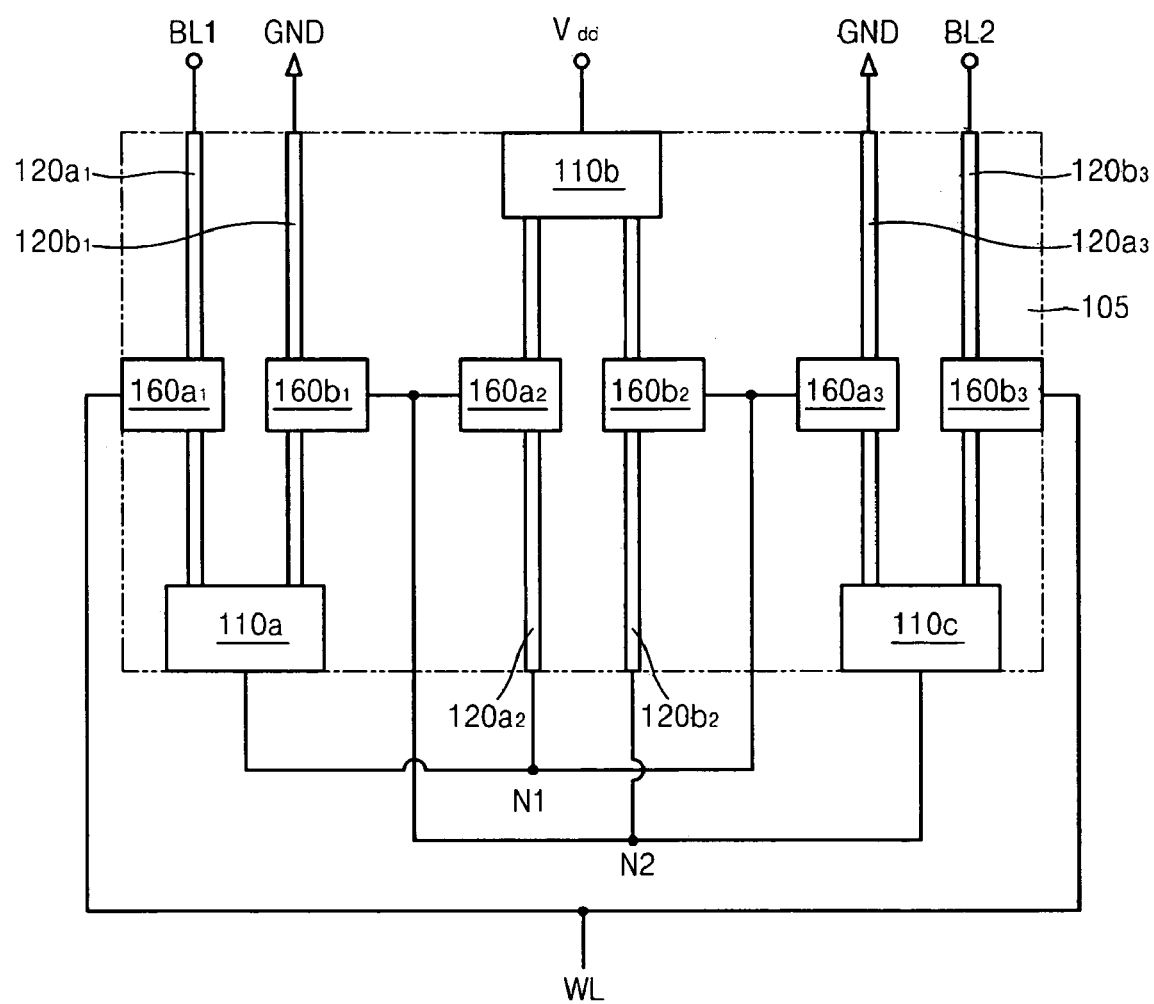
FIG. 8 is a top plan view illustrating an application of the semiconductor device of FIG. 7.
Figure 9:
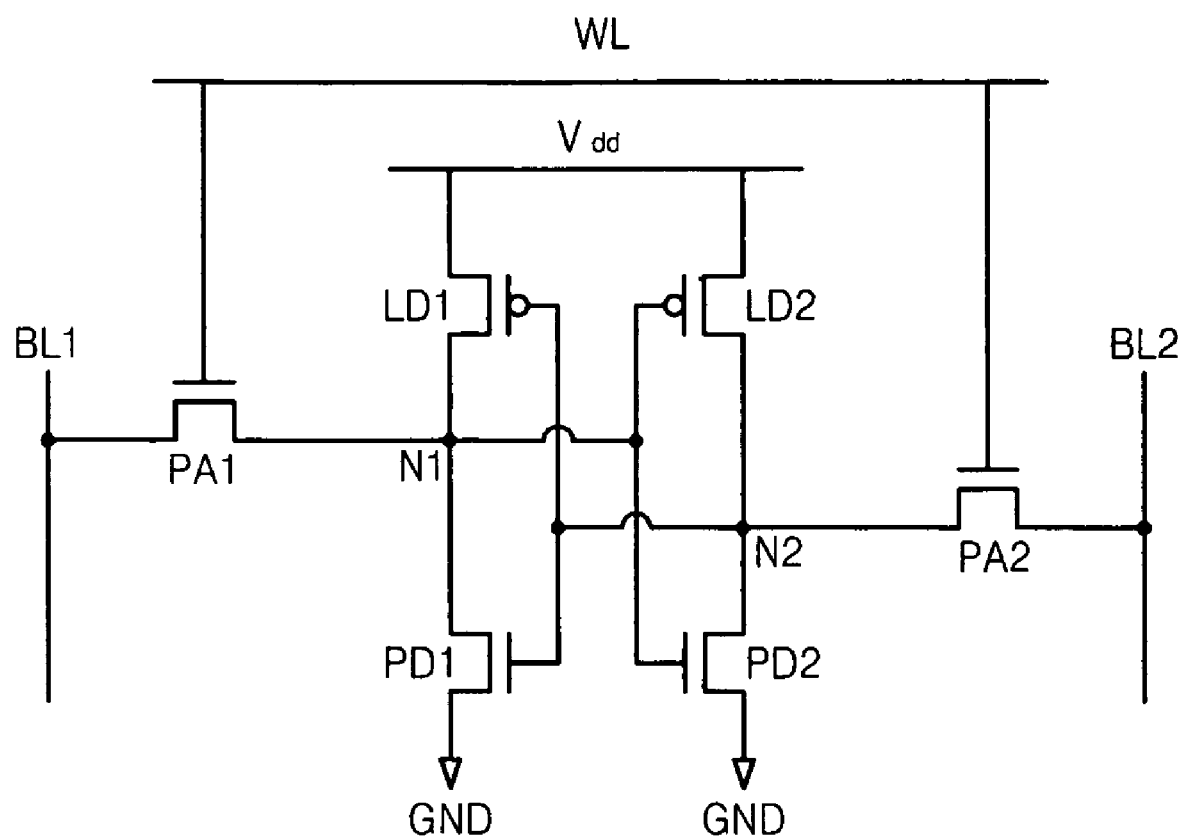
FIG. 9 is an example equivalent circuit diagram of the semiconductor device of FIG. 8.

Hereinafter, a semiconductor device according to another example embodiment will be described with reference to FIGS. 7 through 9. FIG. 7 is a top plan view illustrating a semiconductor device according to another example embodiment. FIG. 8 is a top plan view illustrating an application of the semiconductor device of FIG. 7. FIG. 9 is an example equivalent circuit diagram of the semiconductor device of FIG. 8. For example, the semiconductor device according to an example embodiment may use the configuration of the semiconductor device according to example embodiments of FIGS. 4 through 6. Like reference numerals in the drawings denote like elements, and thus their description will be omitted.

Referring to FIG. 7, the semiconductor device may include a semiconductor substrate, which may include a body 105, supporting posts 110a, 110b, and 110c, and/or first, second and third pairs of fins $120a_1$, $120b_1$; $120a_2$, $120b_2$; $120a_3$, and $120b_3$. The supporting posts 110a, 110b, and 110c may protrude upward from the body 105. The first pair of fins 120a, and 120b, may be connected at one end and supported by the first support post 110a. The second pair of fins $120a_2$ and $120b_2$ may be connected at one end and supported by the second support post 110b. The third pair of fins $120a_3$ and $120b_3$ may be connected and supported by the third support post 110c.

A first pass gate electrode $160a_1$ and a first pull down gate electrode $160b_1$ may enclose parts of the first pair of fins $120a_1$ and $120b_1$ respectively, and may be insulated from the semiconductor substrate. For example, the first pass gate electrode $160a_1$ may enclose the left of the first pair of fins $120a_1$ and 120b, that may be $120a_1$, and the first pull down gate electrode $160b_1$ may enclose the right of the first pair of fins $120a_1$ and $120b_1$, that may be, $120b_1$.

A first load gate electrode $160a_2$ and a second load gate electrode $160b_2$ may enclose parts of the second pair of fins $120a_2$ and $120b_2$ respectively, and may be insulated from the semiconductor substrate. For example, the first load gate electrode $160a_2$ may enclose the left of the second pair of fins $120a_2$ and $120b_2$, that may be $120a_2$, and the second load gate electrode $160b_2$ may enclose the right of the second pair of fins $120a_2$ and $120b_2$, that may be the fin $120b_2$.

A second pull down gate electrode $160a_3$ and a second pass gate electrode $160b_3$ may enclose parts of the third pair of fins $120a_3$ and $120b_3$ respectively, and may be insulated from the semiconductor substrate. For example, the second pull down gate electrode $160a_3$ may enclose the left of the third pair of fins $120a_3$ and $120b_3$, that may be $120a_3$, and the second pass gate electrode $160b_3$ may enclose the right of the third pair of fins $120a_3$ and $120b_3$, that may be, $120b_3$.

The first supporting post 110a, the first pair of fins $120a_1$ and $120b_1$, the first pass gate electrode $160a_1$, and the first pull down gate electrode $160b_1$ may form a pair of finFETs that may have a GAA structure. The second supporting post 110b, the second pair of fins $120a_2$ and $120b_2$, the first load gate electrode $160a_2$, and the second load gate electrode $160b_2$ may form another pair of finFETs that may have a GAA structure. Further, the third supporting post 110c, the third pair of fins $120a_3$ and $120b_3$, the second pull down gate electrode $160a_3$, and the second pass gate electrode $160b_3$ may form another pair of finFETs that may have a GAA structure. Detailed structures of these three pairs of finFETs that may have the GAA structure may be similar to that of the semiconductor device of FIGS. 4 through 6, and thus detailed descriptions thereof will be omitted.

The three pairs of finFETs that may have the GAA structure may be used as an SRAM device as illustrated in FIG. 8, according to an example embodiment. FIG. 9 illustrates an example equivalent circuit diagram of the SRAM device of FIG. 8, according to an example embodiment. Referring to FIG. 8, the left first fin $120a_1$ may be used as a first bit line BL1, and the right first fin $120b_1$ may be connected to a ground GND. The second supporting post 110b may be used as a power line Vdd. The left third fin $120a_3$ may be connected to the ground GND, and the right third fin $120b_3$ may be used as a second bit line BL2. The first and second pass gate electrodes $160a_1$ and $160b_3$ may be connected by a word line WL.

The first supporting post 110a, the second load gate electrode $160b_2$, the second pull down gate electrode $160a_3$, and the left second fin $120a_2$ may be connected to a first node N1. The third supporting post 110c, the first pull down gate electrode $160b_1$, the first load gate electrode $160a_2$, and the right second fin $120b_2$ may be connected to a second node N2.

The first pair of fins $120a_1$ and $120b_1$ and the first supporting post 110a may be doped with first conductive impurities. The second pair of fins $120a_2$ and $120b_2$ and the second supporting post 110b may be doped with second conductive impurities. The third pair of fins $120a_3$ and $120b_3$ and the third supporting post 110c may be doped with the first conductive impurities. For example, the first conductive impurities may be N type impurities, and the second conductive impurities may be P type impurities.

Referring to FIGS. 8 and 9 together, the first pass gate electrode 160a, and the left first fin $120a_1$ may form a first pass finFET PA1, and the second pass gate electrode $160b_3$ and the right third fin $120b_3$ may form a second pass finFET PA2. The first load gate electrode $160a_2$ and the left second fin $120a_2$ may form a first load finFET LD1, and the second load gate electrode $160b_2$ and the right second fin $120b_2$ may form a second load finFET LD2. The first pull down gate electrode $160b_1$ and the right first fin $120b_1$ may form a first pull down finFET PD1, and the second pull down gate electrode $160a_3$ and the left third fin $120a_3$ may form a second pull down finFET PD2.

The SRAM device according to an example embodiment may occupy, for instance, an area of 5 F×9 F, or 45 $F^2$. Thus, the SRAM device of example embodiments may be about half the size of a conventional SRAM device occupying an area of about 90 $F^2$. In this manner, the SRAM device of example embodiments may be fabricated with higher integration density. Furthermore, the SRAM device may be composed of finFETs having a GAA structure, thus having higher performance characteristics such as higher operating speed.

Hereinafter, a method of fabricating a semiconductor device that may have a GAA structure according to an example embodiment will be described with reference to FIGS. 10 through 14.

Figure 10:
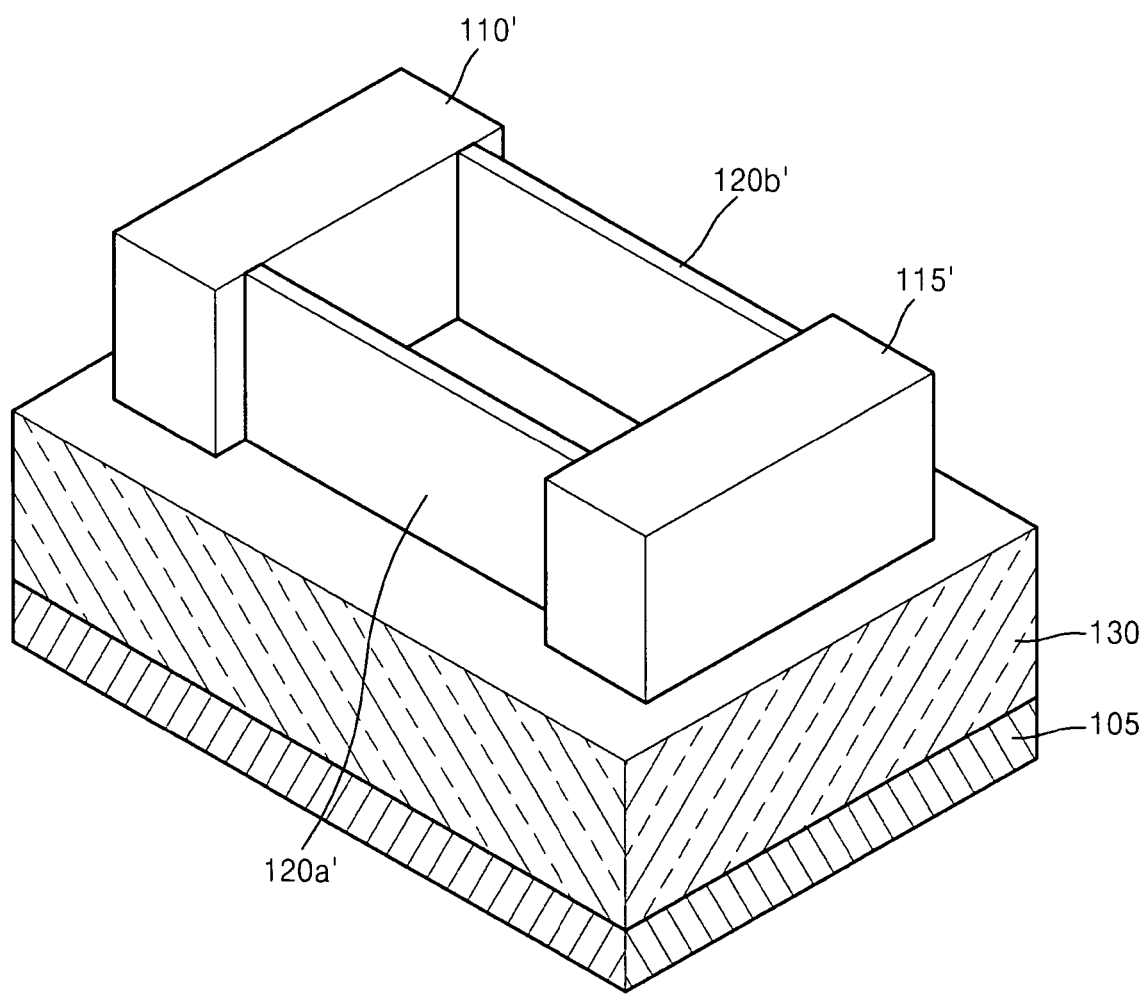
FIGS. 10 through 14 are perspective views illustrating a method of fabricating a semiconductor device that may have a gate-all-around (GAA) structure, according to an example embodiment.

Referring to FIG. 10, a semiconductor substrate may be selectively etched to form a pair of supporting posts 110' and 115' and fins 120a' and 120b', all of which may protrude from a body 105. Both ends of each of the fins 120a' and 120b' may be connected to and supported by the supporting posts 110' and 115'. A device insulating layer 130 may be formed on the body 105 so as to expose upper portions of the supporting posts 110' and 115' and fins 120a' and 120b'.

Figure 11:
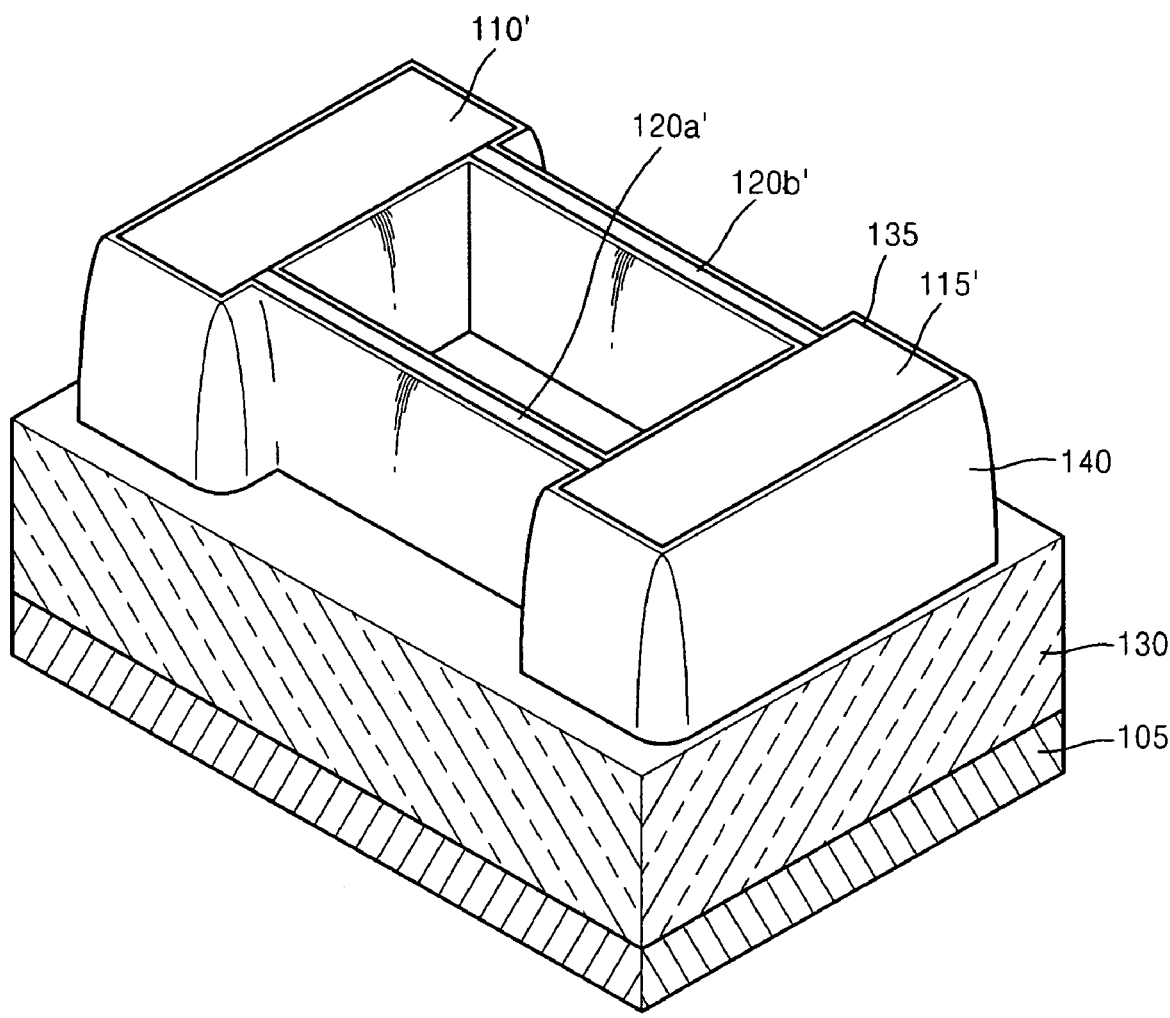

Referring to FIG. 11, a buffer insulating layer 135 and a spacer insulating layer 140 may be formed on sidewalls of the portions of the supporting posts 110' and 115' and fins 120a' and **120*b*', which may be exposed from the device insulating layer 130. The buffer insulating layer 135 may act to relieve stress of the spacer insulating layer 140, but example embodiments may not be limited thereto, and the buffer insulating layer 135** may be omitted.

For example, the buffer insulating layer 135 may include an oxide layer, and the spacer insulating layer 140 may include a nitride layer. The spacer insulating layer 140 may be formed by forming and anisotropically etching a spacer insulating layer pre-form (not shown). The spacer insulating layer 140 can have an etch selectivity with respect to the device insulating layer 130.

Figure 12:
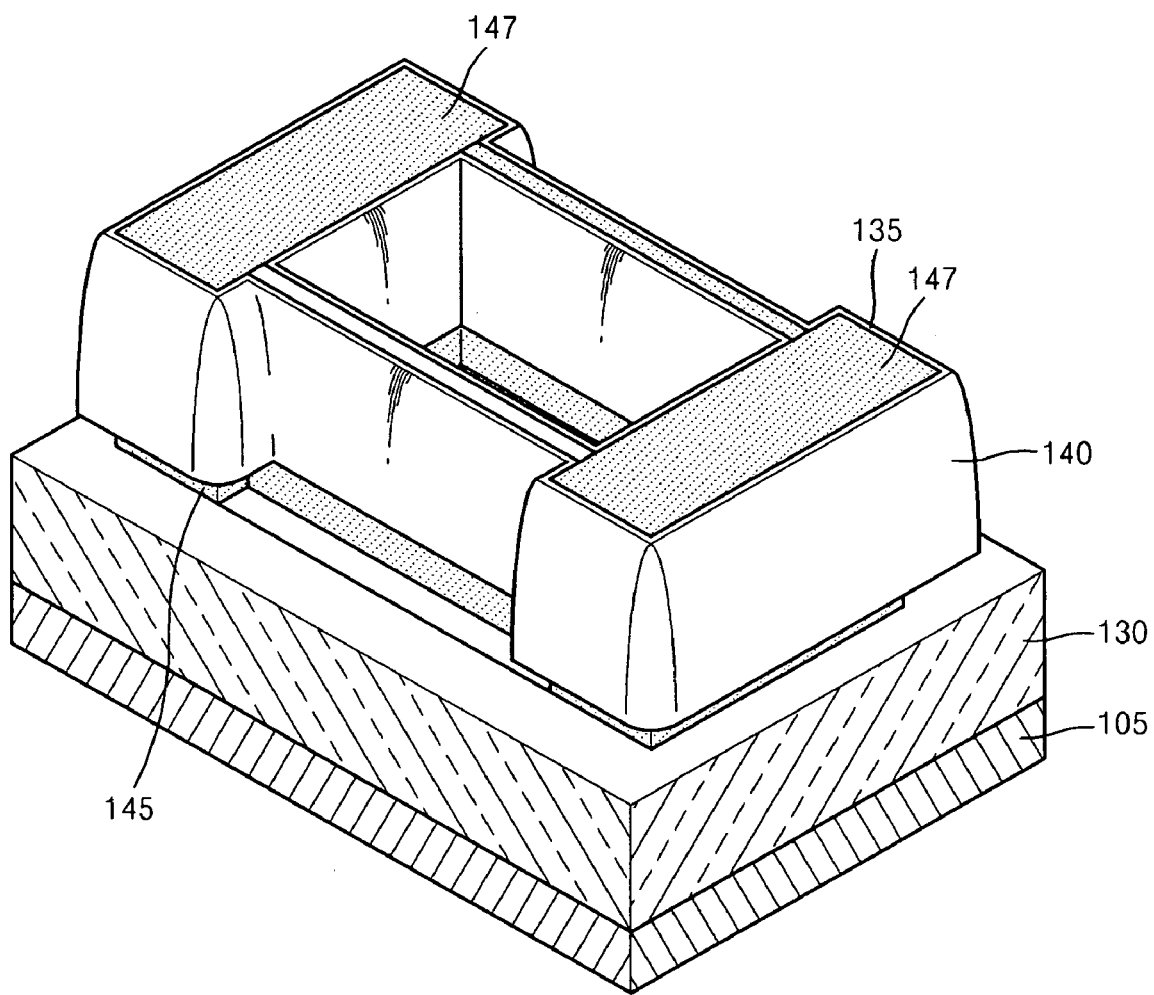

Referring to FIG. 12, the device insulating layer 130 may be etched at a predetermined or desired thickness using the spacer insulating layer 140 as an etch mask. Thus, parts of the supporting posts 110' and 115' and fins **120*a*' and 120*b*' which may be located below the spacer insulating layer 140 may be exposed from the device insulating layer 130. For example, the device insulating layer 130** may be etched to a predetermined or desired thickness using isotropic wet etching.

Surfaces of the exposed parts of the supporting posts 110' and 115' and the exposed parts of the fins **120*a*' and 120*b*' may be oxidized to form a sacrificial oxide layer 145. In an example embodiment, another sacrificial oxide layer 147 may be simultaneously formed on top surfaces of the supporting posts 110' and 115' and fins 120*a*' and 120*b*' that may be exposed from the spacer insulating layer 140. During oxidization, the exposed parts of the fins 120*a*' and 120*b*'** may be entirely oxidized in a widthwise direction.

Because the supporting posts 110' and 115' may have a relatively greater width than the fins **120*a*' and 120*b*', the sacrificial oxide layers 145 and 147 may be formed only on the surfaces of the supporting posts 110' and 115'. Thus, an oxidization time may be controlled so as to oxidize all the exposed parts of the fins 120*a*' and 120*b*' in a widthwise direction, and only the surfaces of the exposed parts of the supporting posts 110'**.

Figure 13:
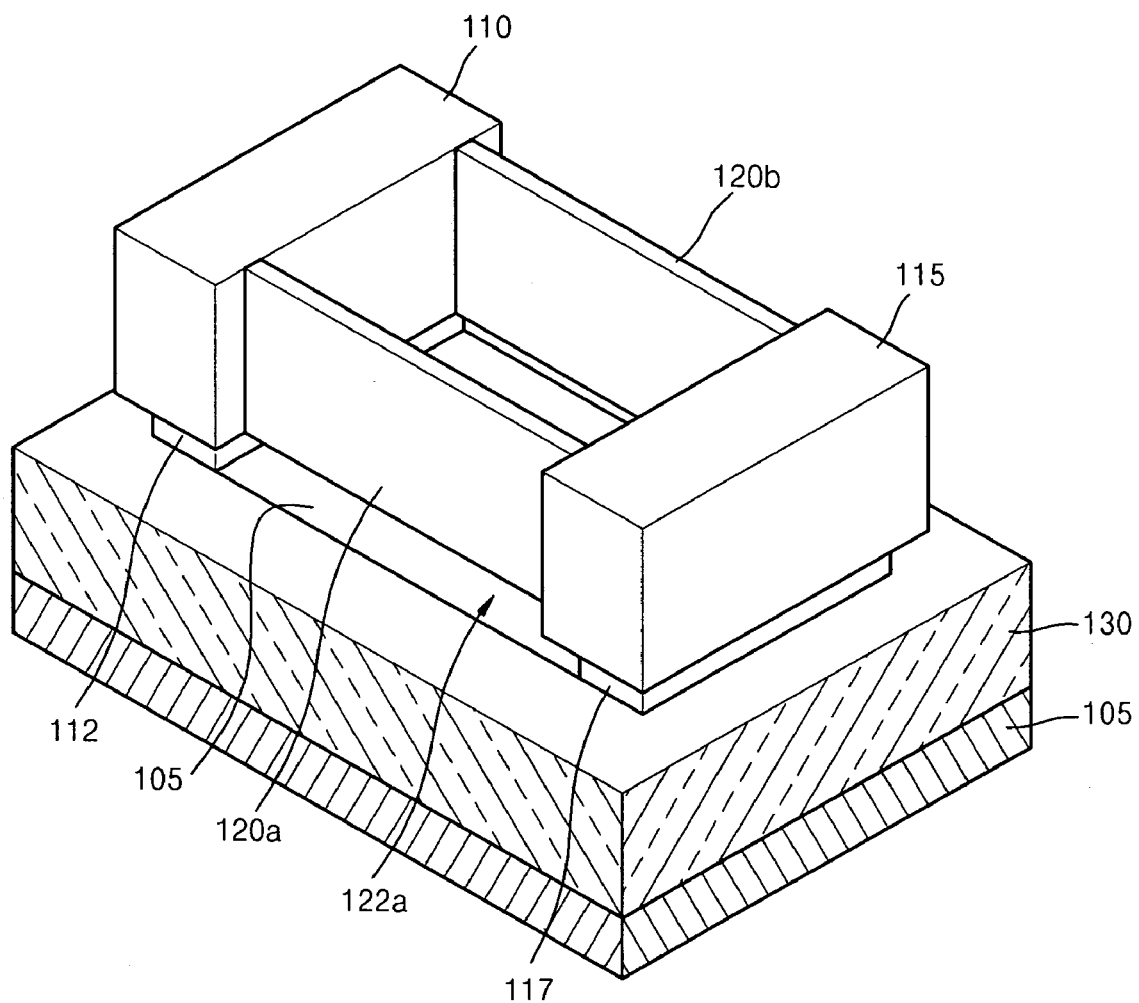

Referring to FIG. 13, the sacrificial oxide layers 145 and 147 (FIG. 12), the buffer insulating layer 135, and the spacer insulating layer 140 may be removed. Thereby, sink regions 112 and 117 of the supporting posts 110 and 115, and fins **120*a* and 120*b* separated from the body 105 by a tunnel 122*a* and another tunnel (not shown) may be formed. Both ends of each of the fins 120*a* and 120*b* may be supported by the supporting posts 110 and 115**.

For example, the sacrificial oxide layers 145 and 147, the buffer insulating layer 135, and the spacer insulating layer 140 may be removed by wet etching. The sacrificial oxide layers 145 and 147, and the buffer insulating layer 135 may be removed in a wet etching solution containing hydrofluoric acid, and the spacer insulating layer 140 may be removed in a wet etching solution containing phosphoric acid.

Figure 14:
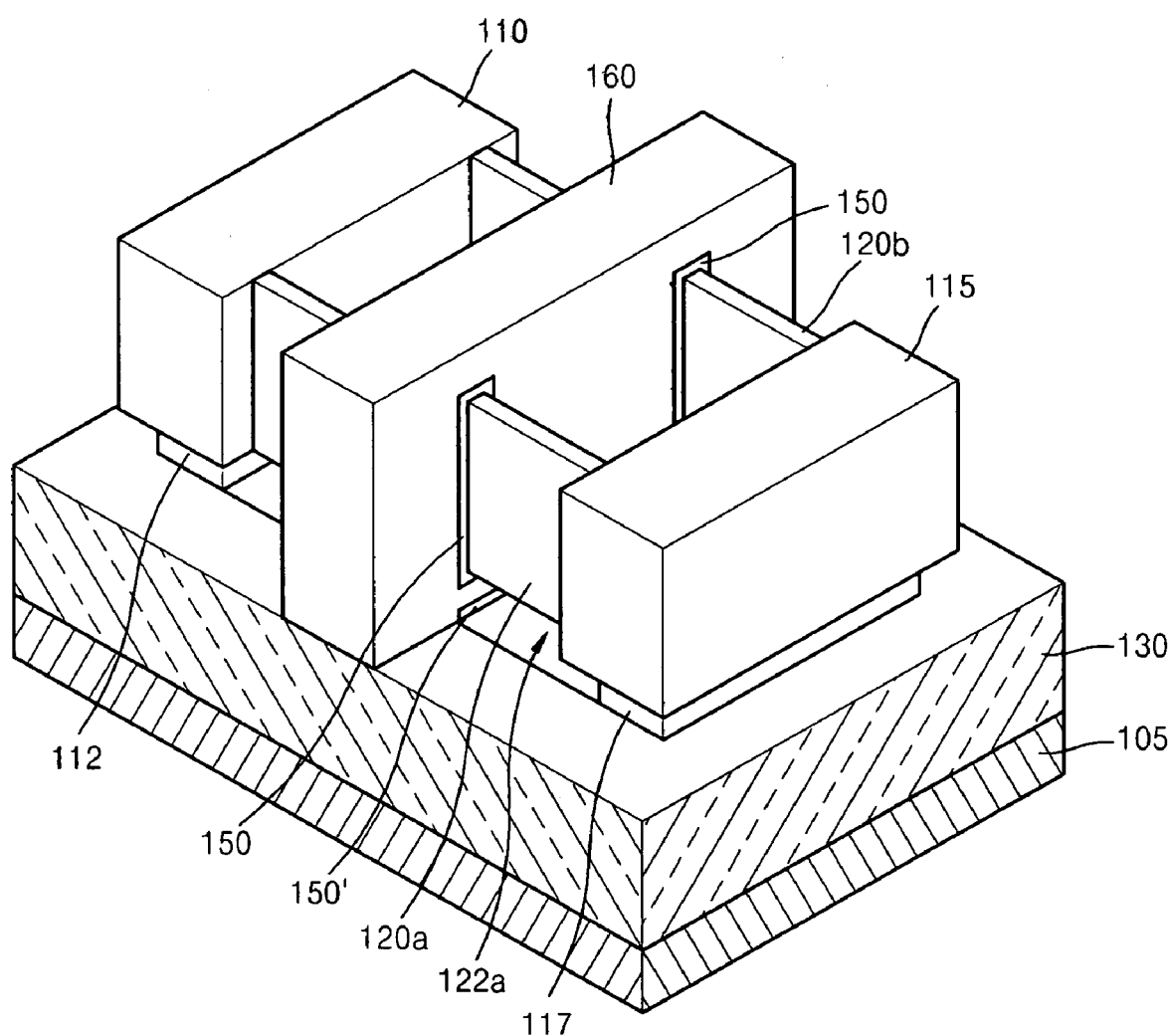

Referring to FIG. 14, a first gate insulating layer 150 and a common gate electrode 160 may be formed. The common gate electrode 160 may enclose parts of the fins **120*a* and 120*b*, and may be insulated from the fins 120*a* and 120*b* by the first gate insulating layer 150. Moreover, the common gate electrode 160 may be insulated from the body 105 by a second gate insulating layer 150' and the device insulating layer 130**.

A source region and a drain region (not shown) may be formed by doping impurities into the portions of the fins **120*a* and 120*b* located on opposite sides of the common gate electrode 160 as well as the supporting posts 110 and 115**. A metal interconnection may be formed based on a method known to those having an ordinary skill in the art.

According to example embodiments, a finFET may be fabricated so as to have a GAA structure using a bulk semiconductor substrate. A method of fabricating the finFET having the GAA structure according to an example embodiment may decrease fabrication costs compared to a conventional method using a SOI wafer or an epitaxial layer.

Although the fins **120*a* and 120*b* may have been described to be supported by a pair of supporting posts 110 and 115, the fins 120*a* and 120*b* may be supported by only the supporting post 110. For example, the second supporting post 115 may be etched and removed from the structure of FIG. 13 or 14. Furthermore, by etching the middle portion of the common gate electrode 160, the common gate electrode 160** may be divided into two gate electrodes.

Although example embodiments have been shown and described in this specification and figures, it would be appreciated by those skilled in the art that changes may be made to the illustrated and/or described example embodiments without departing from their principles and spirit, the scope of which is defined by the claims and their equivalents.

What is claimed:

1. A semiconductor device having a gate-all-around (GAA) structure, comprising:
    a semiconductor substrate having a body, at least one supporting post protruding from the body, and at least one pair of fins separated from the body, wherein at least one end of each fin of the at least one pair of fins is connected to and supported by the at least one supporting post, and the at least one pair of fins of the semiconductor substrate is doped with first conductive impurities;
    at least one common gate electrode enclosing a portion of each fin of the at least one pair of fins of the semiconductor substrate, insulated from the semiconductor substrate;
    at least one gate insulating layer between the at least one common gate electrode and the at least one pair of fins of the semiconductor substrate; and
    a source region and a drain region on other portions of the at least one pair of fins which are located on opposite sides of the at least one common gate electrode and doped with second conductive impurities, wherein the at least one supporting post of the semiconductor substrate is doped with the second conductive impurities.

2. The semiconductor device of claim 1, wherein the at least one supporting post comprises a pair of supporting posts, wherein both ends of each fin of the at least one pair of fins are connected to and supported by the pair of supporting posts.

3. The semiconductor device of claim 1, wherein the at least one common gate electrode comprises:
    a first gate electrode enclosing a portion of a first fin of the at least one pair of fins; and
    a second gate electrode enclosing a portion of a second fin of the at least one pair of fins.

4. The semiconductor device of claim 1, wherein the at least one supporting post comprises a pair of supporting posts, wherein both ends of each fin of the at least one pair of fins are connected to and supported by the pair of supporting posts, and wherein the at least one common gate electrode comprises a first gate electrode enclosing a portion of a first fin of the at least one pair of fins; and a second gate electrode enclosing a portion of a second fin of the at least one pair of fins.

5. The semiconductor device of claim 1, wherein the at least one supporting post comprises at least one sink region that is recessed along an outer circumference of the at least one supporting post below the lower ends of the at least one pair of fins.

6. The semiconductor device of claim 1, wherein the semiconductor substrate comprises a bulk wafer in which the body, the at least one pair of fins, and the at least one supporting post is formed of the same semiconductor material.

7. The semiconductor device of claim 6, wherein the bulk wafer comprises a silicon wafer or a silicon germanium wafer.

8. The semiconductor device of claim 1, further comprising:
a device insulating layer between part of the at least one common gate electrode and the body.

9. The semiconductor device of claim 2, wherein the pair of supporting posts comprise sink regions that are each recessed along an outer circumference of each of the supporting posts below the lower ends of the at least one pair of fins.

10. The semiconductor device of claim 2, wherein the semiconductor substrate comprises a bulk wafer in which the body, the at least one pair of fins, and the pair of supporting posts are formed of the same semiconductor material.

11. The semiconductor device of claim 10, wherein the bulk wafer comprises a silicon wafer or a silicon germanium wafer.

12. A semiconductor device having a gate-all-around (GAA) structure, comprising:
a semiconductor substrate having a body, a pair of supporting posts protruding from the body, and at least one pair of fins separated from the body, wherein both ends of each fin of the at least one pair of fins are connected to and supported by the pair of supporting posts;
at least one common gate electrode enclosing a portion of each fin of the at least one pair of fins of the semiconductor substrate, insulated from the semiconductor substrate;
at least one gate insulating layer between the at least one common gate electrode and the at least one pair of fins of the semiconductor substrate; and
a source region and a drain region on other portions of the at least one pair of fins which are located on opposite sides of the common gate electrode and doped with second conductive impurities,
wherein the at least one pair of fins of the semiconductor substrate are each doped with first conductive impurities, and
wherein the pair of supporting posts of the semiconductor substrate are doped with the second conductive impurities.

13. The semiconductor device of claim 12, further comprising:
a device insulating layer between part of the at least one common gate electrode and the body.

14. The semiconductor device of claim 3, wherein the at least one supporting post comprises at least one sink region that is recessed along an outer circumference of the at least one supporting post below the lower ends of the at least one pair of fins.

15. The semiconductor device of claim 3, wherein the semiconductor substrate comprises a bulk wafer in which the body, the at least one supporting post, and the at least one pair of fins are formed of the same semiconductor material.

16. The semiconductor device of claim 3, wherein the first fin of the at least one pair of fins of the semiconductor substrate is doped with first conductive impurities, and the second fin of the at least one pair of fins is doped with second conductive impurities.

17. The semiconductor device of claim 16, further comprising: a first source region and a first drain region that are formed on other portions of the first fin of the at least one pair of fins of the semiconductor substrate which are located on opposite sides of the first gate electrode and doped with the second conductive impurities, and
a second source region and a second drain region that are formed on other portions of the second fin of the at least one pair of fins of the semiconductor substrate which are located on opposite sides of the second gate electrode and doped with the first conductive impurities.

18. The semiconductor device of claim 17, wherein:
a high voltage is applied to the first drain region; and a low voltage is applied to the second drain region; and
the first and second gate electrodes constitute a common input terminal; and the first and second source regions constitute a common output terminal.

19. The semiconductor device of claim 4, wherein the pair of supporting posts comprise sink regions that are each recessed along an outer circumference of each of the supporting posts below the lower ends of the at least one pair of fins.

20. The semiconductor device of claim 4, wherein the semiconductor substrate comprises a bulk wafer in which the body, the at least one pair of fins, and the pair of supporting posts are formed of the same semiconductor material.

21. The semiconductor device of claim 4, wherein the first fin of the at least one pair of fins of the semiconductor device is doped with first conductive impurities, and the second fin of the at least one pair of fins is doped with second conductive impurities.

22. The semiconductor device of claim 21, further comprising:
a first source region and a first drain region that are formed on other portions of the first fin of the at least one pair of fins of the semiconductor substrate which are located on opposite sides of the first gate electrode and doped with the second conductive impurities; and
a second source region and a second drain region that are formed on other portions of the second fin of the at least one pair of fins of the semiconductor substrate which are located on opposite sides of the second gate electrode and doped with the first conductive impurities.

23. The semiconductor device of claim 1, wherein the at least one supporting post comprises first, second and third supporting posts, wherein the at least one pair of fins comprises first, second, and third pairs of fins, wherein one end of each fin of each of the first, second, and third pairs is connected to and supported by each of the first, second, and third supporting posts, respectively, and
wherein the at least one common gate electrode comprises
a first pass gate electrode enclosing a portion of one of the first pair of fins connected to the first supporting post of the semiconductor substrate and insulated from the semiconductor substrate,
a first pull down gate electrode enclosing a portion of the other of the first pair of fins connected to the first supporting post of the semiconductor substrate and insulated from the semiconductor substrate,
a first load gate electrode enclosing a portion of one of the second pair of fins connected to the second supporting post of the semiconductor substrate and insulated from the semiconductor substrate,
a second load gate electrode enclosing a portion of the other of the second pair of fins connected to the second supporting post of the semiconductor substrate and insulated from the semiconductor substrate,
a second pull down gate electrode enclosing a portion of one of the third pair of fins connected to the third supporting post of the semiconductor substrate and insulated from the semiconductor substrate, and a second pass gate electrode enclosing a portion of the other of the third pair of fins connected to the third supporting post of the semiconductor substrate and insulated from the semiconductor substrate.

24. The semiconductor device of claim 23, wherein the first, second, and third supporting posts comprise sink regions that are each recessed along an outer circumference of each of the supporting posts below the lower ends of the first, second, and third pairs of fins.

25. The semiconductor device of claim 23, wherein the semiconductor substrate comprises a bulk wafer in which the body, the first, second, and third supporting posts, and the first, second, and third pairs of fins are formed of the same semiconductor material.

26. The semiconductor device of claim 23, wherein the first pair of fins of the semiconductor substrate is doped with first conductive impurities;
the second pair of fins of the semiconductor substrate is doped with second conductive impurities; and
the third pair of fins of the semiconductor substrate is doped with the first conductive impurities.

27. The semiconductor device of claim 26, wherein the first supporting post of the semiconductor substrate is doped with the first conductive impurities;
the second supporting post of the semiconductor substrate is doped with the second conductive impurities; and the third supporting post of the semiconductor substrate is doped with the first conductive impurities.

28. The semiconductor device of claim 27, wherein the first supporting post, one of the second pair of fins, the second load gate electrode, and the second pull down gate electrode are electrically connected to each other;
the third supporting post, the other of the second pair of fins, the first load gate electrode, and the first pull down gate electrode are electrically connected to each other;
the first pass gate electrode and the second pass gate electrode are interconnected and used as a word line; and
the second supporting post is used as a power line, and one of the first pair of fins and the other of the third pair of fins are each used as a bit line.

* * * * *